(12) United States Patent
Huang et al.

(10) Patent No.: US 10,867,805 B2
(45) Date of Patent: Dec. 15, 2020

(54) SELECTIVE REMOVAL OF AN ETCHING STOP LAYER FOR IMPROVING OVERLAY SHIFT TOLERANCE

(71) Applicant: Taiwan Semiconductor Manufacturing Co., Ltd., Hsin-Chu (TW)

(72) Inventors: Chien-Hua Huang, Miaoli County (TW); Tzu-Hui Wei, Zhubei (TW); Cherng-Shiaw Tsai, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/195,304

(22) Filed: Nov. 19, 2018

(65) Prior Publication Data

US 2020/0006083 A1    Jan. 2, 2020

Related U.S. Application Data

(60) Provisional application No. 62/692,095, filed on Jun. 29, 2018.

(51) Int. Cl.
*H01L 21/311* (2006.01)
*H01L 21/768* (2006.01)
(Continued)

(52) U.S. Cl.
CPC .. *H01L 21/31144* (2013.01); *H01L 21/02321* (2013.01); *H01L 21/0332* (2013.01);
(Continued)

(58) Field of Classification Search
CPC ............... H01L 23/522; H01L 23/5226; H01L 21/76877–7688; H01L 21/76829–76832; H01L 21/768–76813; H01L 21/02321; H01L 21/02123; H01L 21/02142–02161; H01L 21/31056; H01L 21/475–47573; H01L 21/47635; H01L 21/477; H01L 21/02148; H01L 21/0215; H01L 21/02145; H01L 21/02153; H01L 21/02156;
(Continued)

(56) References Cited

U.S. PATENT DOCUMENTS 6,788,477 B2    9/2004  Lin
7,741,222 B2 *  6/2010  You ......................... H01L 28/91
                                                      216/57
(Continued)

*Primary Examiner* — Sonya McCall-Shepard
(74) *Attorney, Agent, or Firm* — Haynes and Boone, LLP

(57) ABSTRACT

An example embodiment of the present disclosure involves a method for semiconductor device fabrication. The method comprises providing a structure that includes a conductive component and an interlayer dielectric (ILD) that includes silicon and surrounds the conductive component, and forming, over the conductive component and the ILD, an etch stop layer (ESL) that includes metal oxide. The ESL includes a first portion in contact with the conductive component and a second portion in contact with the ILD. The method further comprises baking the ESL to transform the metal oxide located in the second portion of the ESL into metal silicon oxide, and selectively etching the ESL so as to remove the first portion of the ESL but not the second portion of the ESL.

20 Claims, 8 Drawing Sheets

(51) Int. Cl.
    *H01L 23/528* (2006.01)
    *H01L 23/522* (2006.01)
    *H01L 21/033* (2006.01)
    *H01L 21/8234* (2006.01)
    *H01L 21/02* (2006.01)
    *H01L 23/532* (2006.01)
    H01L 21/321 (2006.01)

(52) U.S. Cl.
    CPC .... *H01L 21/0337* (2013.01); *H01L 21/31111* (2013.01); *H01L 21/31116* (2013.01); *H01L 21/76802* (2013.01); *H01L 21/76877* (2013.01); *H01L 23/528* (2013.01); *H01L 23/5226* (2013.01); *H01L 23/5329* (2013.01); H01L 21/02142 (2013.01); H01L 21/02145 (2013.01); H01L 21/02148 (2013.01); H01L 21/02153 (2013.01); H01L 21/3212 (2013.01); H01L 21/7684 (2013.01); H01L 21/823475 (2013.01)

(58) Field of Classification Search
    CPC ......... H01L 21/02159; H01L 21/31645; H01L 21/31641; H01L 21/31637; H01L 21/02189; H01L 21/02186; H01L 21/02183; H01L 21/02181; H01L 21/76808; H01L 21/7681; H01L 21/76811; H01L 21/0337; H01L 21/31144; H01L 21/302; H01L 21/311–31116; H01L 21/76802; H01L 21/76834; H01L 21/7684; H01L 21/3212; H01L 21/76897; H01L 21/0332–0337; H01L 23/5329–53295; H01L 21/823475
    See application file for complete search history.

(56) References Cited

U.S. PATENT DOCUMENTS

| | | | |
|---|---|---|---|
| 8,039,179 B2 | 10/2011 | Shieh et al. |
| 8,199,314 B2 | 6/2012 | Peng et al. |
| 8,202,680 B2 | 6/2012 | Chang |
| 8,202,681 B2 | 6/2012 | Lin et al. |
| 8,208,116 B2 | 6/2012 | Lin et al. |
| 8,216,767 B2 | 7/2012 | Wang et al. |
| 8,253,922 B2 | 8/2012 | Lin et al. |
| 8,264,662 B2 | 9/2012 | Chen et al. |
| 8,323,870 B2 | 12/2012 | Lee et al. |
| 8,383,322 B2 | 2/2013 | Chang et al. |
| 8,415,091 B2 | 4/2013 | Chang |
| 8,464,186 B2 | 6/2013 | Wang et al. |
| 8,468,473 B1 | 6/2013 | Wang et al. |
| 8,473,877 B2 | 6/2013 | Wang et al. |
| 8,507,159 B2 | 8/2013 | Wang et al. |
| 8,510,687 B1 | 8/2013 | Liu et al. |
| 8,524,427 B2 | 9/2013 | Shin et al. |
| 8,527,916 B1 | 9/2013 | Chiang et al. |
| 8,530,121 B2 | 9/2013 | Wang et al. |
| 8,563,224 B1 | 10/2013 | Chen et al. |
| 8,564,759 B2 | 10/2013 | Chang et al. |
| 8,572,520 B2 | 10/2013 | Chou et al. |
| 8,580,117 B2 | 11/2013 | Kao et al. |
| 8,584,057 B2 | 11/2013 | Liu et al. |
| 8,589,828 B2 | 11/2013 | Lee et al. |
| 8,589,830 B2 | 11/2013 | Chang et al. |
| 8,601,407 B2 | 12/2013 | Wang et al. |
| 8,609,308 B1 | 12/2013 | Chen et al. |
| 8,627,241 B2 | 1/2014 | Wang et al. |
| 8,628,897 B1 | 1/2014 | Lu et al. |
| 8,631,360 B2 | 1/2014 | Wang et al. |
| 8,631,361 B2 | 1/2014 | Feng |
| 8,658,344 B2 | 2/2014 | Wang et al. |
| 8,677,511 B2 | 3/2014 | Wang et al. |
| 8,679,707 B2 | 3/2014 | Lee et al. |
| 8,691,476 B2 | 4/2014 | Yu et al. |
| 8,709,682 B2 | 4/2014 | Chen et al. |
| 8,715,890 B2 | 5/2014 | Tu et al. |
| 8,715,919 B2 | 5/2014 | Chang et al. |
| 8,716,841 B1 | 5/2014 | Chang et al. |
| 8,722,286 B2 | 5/2014 | Yu et al. |
| 8,728,332 B2 | 5/2014 | Lin et al. |
| 8,732,626 B2 | 5/2014 | Liu et al. |
| 8,736,084 B2 | 5/2014 | Cheng et al. |
| 8,739,080 B1 | 5/2014 | Tsai et al. |
| 8,741,551 B2 | 6/2014 | Wu et al. |
| 8,745,550 B2 | 6/2014 | Cheng et al. |
| 8,751,976 B2 | 6/2014 | Tsai et al. |
| 8,753,788 B1 | 6/2014 | Yu et al. |
| 8,762,900 B2 | 6/2014 | Shin et al. |
| 8,764,995 B2 | 7/2014 | Chang et al. |
| 8,765,330 B2 | 7/2014 | Shih et al. |
| 8,765,582 B2 | 7/2014 | Hsu et al. |
| 8,767,178 B2 | 7/2014 | Lin et al. |
| 8,772,109 B2 | 7/2014 | Colinge |
| 8,785,084 B2 | 7/2014 | Lu et al. |
| 8,785,285 B2 | 7/2014 | Tsai et al. |
| 8,802,354 B2 | 8/2014 | Chang |
| 8,812,999 B2 | 8/2014 | Liu et al. |
| 8,816,444 B2 | 8/2014 | Wann et al. |
| 8,822,106 B2 | 9/2014 | Wang et al. |
| 8,822,243 B2 | 9/2014 | Yan et al. |
| 8,823,065 B2 | 9/2014 | Wang et al. |
| 8,828,625 B2 | 9/2014 | Lu et al. |
| 8,828,632 B2 | 9/2014 | Wang et al. |
| 8,835,082 B2 | 9/2014 | Chen et al. |
| 8,837,810 B2 | 9/2014 | Chen et al. |
| 8,841,047 B2 | 9/2014 | Yu et al. |
| 8,841,049 B2 | 9/2014 | Wang et al. |
| 8,841,058 B2 | 9/2014 | Chang |
| 8,846,278 B2 | 9/2014 | Shin et al. |
| 8,850,366 B2 | 9/2014 | Liu et al. |
| 8,860,148 B2 | 10/2014 | Hu et al. |
| 8,877,409 B2 | 11/2014 | Hsu et al. |
| 2006/0091468 A1 | 5/2006 | Liaw |
| 2007/0257323 A1* | 11/2007 | Tsui ............... H01L 23/485 257/382 |
| 2011/0281208 A1 | 11/2011 | Lin et al. |
| 2012/0034558 A1 | 2/2012 | Chang |
| 2012/0045192 A1 | 2/2012 | Peng et al. |
| 2012/0180823 A1 | 7/2012 | Peng et al. |
| 2012/0236276 A1 | 9/2012 | Lin et al. |
| 2012/0278776 A1 | 11/2012 | Lei et al. |
| 2012/0308112 A1 | 12/2012 | Hu et al. |
| 2012/0320351 A1 | 12/2012 | Lin et al. |
| 2013/0201461 A1 | 8/2013 | Huang et al. |
| 2013/0202992 A1 | 8/2013 | Chen et al. |
| 2013/0216949 A1 | 8/2013 | Chang |
| 2013/0258304 A1 | 10/2013 | Chang et al. |
| 2013/0267047 A1 | 10/2013 | Shih et al. |
| 2013/0295769 A1 | 11/2013 | Lin et al. |
| 2013/0309611 A1 | 11/2013 | Chang et al. |
| 2013/0320451 A1 | 12/2013 | Liu et al. |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0101624 A1 | 4/2014 | Wu et al. |
| 2014/0109026 A1 | 4/2014 | Wang et al. |
| 2014/0111779 A1 | 4/2014 | Chen et al. |
| 2014/0117563 A1 | 5/2014 | Yu et al. |
| 2014/0119638 A1 | 5/2014 | Chang et al. |
| 2014/0120459 A1 | 5/2014 | Liu et al. |
| 2014/0123084 A1 | 5/2014 | Tang et al. |
| 2014/0134759 A1 | 5/2014 | Lin et al. |
| 2014/0186773 A1 | 7/2014 | Chang |
| 2014/0193974 A1 | 7/2014 | Lee et al. |
| 2014/0215421 A1 | 7/2014 | Chen et al. |
| 2014/0226893 A1 | 8/2014 | Lo et al. |
| 2014/0242794 A1 | 8/2014 | Lin et al. |
| 2014/0253901 A1 | 9/2014 | Zhou et al. |
| 2014/0255850 A1 | 9/2014 | Chang et al. |
| 2014/0256067 A1 | 9/2014 | Cheng et al. |

(56) References Cited

U.S. PATENT DOCUMENTS

| | | |
|---|---|---|
| 2014/0257761 A1 | 9/2014 | Zhou et al. |
| 2014/0264760 A1 | 9/2014 | Chang et al. |
| 2014/0264899 A1 | 9/2014 | Chang et al. |
| 2014/0272709 A1 | 9/2014 | Liu et al. |
| 2014/0272726 A1 | 9/2014 | Chang |
| 2014/0273442 A1 | 9/2014 | Liu et al. |
| 2014/0273446 A1 | 9/2014 | Huang et al. |
| 2014/0273521 A1 | 9/2014 | Wu et al. |
| 2014/0282334 A1 | 9/2014 | Hu et al. |
| 2015/0286146 A1 | 10/2015 | Chang et al. |
| 2015/0309405 A1 | 10/2015 | Shih et al. |
| 2015/0311075 A1 | 10/2015 | Huang et al. |
| 2016/0186106 A1* | 6/2016 | Du ............... G03F 7/425 510/176 |

* cited by examiner

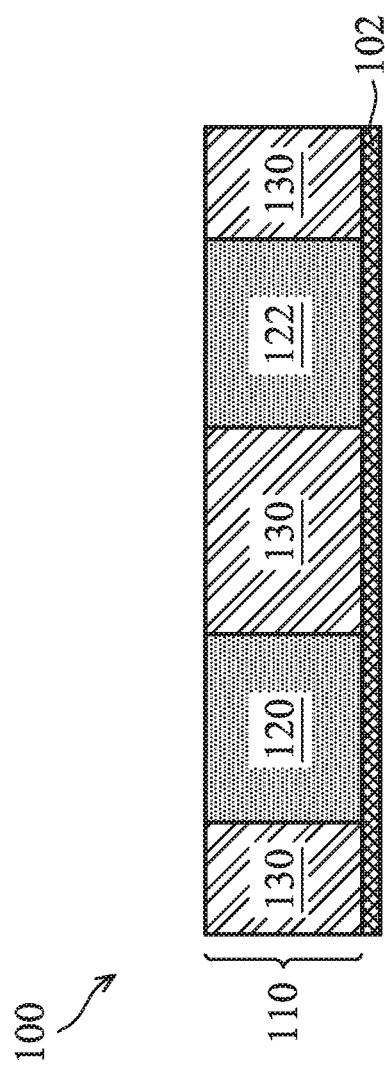
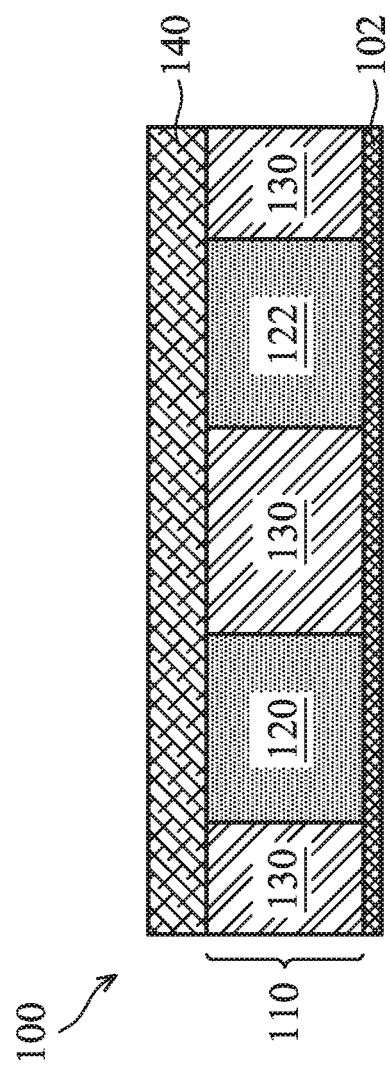

(12) United States Patent
US 10,867,805 B2

SELECTIVE REMOVAL OF AN ETCHING STOP LAYER FOR IMPROVING OVERLAY SHIFT TOLERANCE

PRIORITY

This application claims priority to U.S. Provisional Patent Application Ser. No. 62/692,095 filed Jun. 29, 2018, and entitled "Selective Removal of an Etching Stop Layer for Improving Overlay Shift Tolerance," the entire disclosure of which is hereby incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreasing geometry sizes lead to challenges in semiconductor fabrication. For example, as pitches between metal components decrease, overlay control becomes more difficult because the same amount of overlay shift now has a more significant impact on device performance (e.g., a misaligned via may cause current leakage between the via and a neighboring metal component). An overlay shift may degrade device performance and/or cause reliability issues. Therefore, while existing semiconductor devices and the fabrication thereof have been generally adequate for their intended purposes, they have not been satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 1C, 1D, 1E, 1F, 1G, 1H, and 1I are cross-sectional views of a semiconductor device at various stages of fabrication according to embodiments of the present disclosure.

DETAILED DESCRIPTION

Figure 1C:
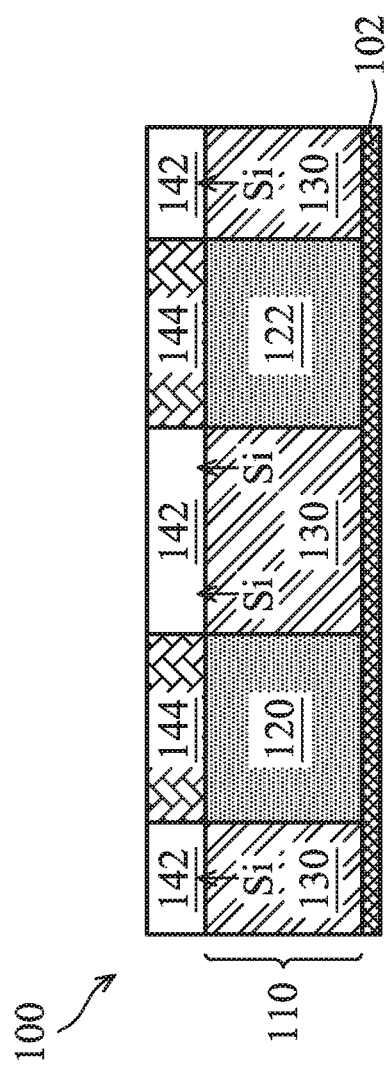

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally directed to, but not otherwise limited to, reducing or preventing problems associated with overlay control. Overlay may refer to the alignment between various components of different layers in a semiconductor device such as an integrated circuit (IC) chip. For example, an IC chip may include an interconnect structure that is made up of multiple interconnect layers (also called different metallization layers). Each interconnect layer may include one or more conductive components—such as vias, contacts, or metal lines—that are surrounded by an interlayer dielectric (ILD). In some instances, a first conductive component in one interconnect layer (e.g., an upper layer) may need to be electrically connected to a second conductive component in another interconnect layer (e.g., a lower layer). Thus it is desirable for these two conductive components to be aligned vertically. If overlay control is unsatisfactory, there may be a significant amount of misalignment between the two conductive components, which could lead to problems such as over-etching of the ILD next to the second conductive component (a tiger tooth like pattern). The over-etching may shorten a current leakage pathway to neighboring conductive components, which may in turn cause reliability and/or performance problems such as time-dependent dielectric breakdown (TDDB) or other current leakage issues.

To overcome the issues discussed above, the present disclosure forms portions of an etch stop layer (ESL) that increases the length of a current leakage pathway. In some embodiments, this is achieved by first forming an ESL (containing a metal oxide) on a conductive component and on an ILD, which contains silicon and surrounds the conductive component. The ESL is then baked at an elevated temperature to change its chemical composition. For example, a metal silicon oxide may be formed in a portion of the ESL in contact with the ILD, as silicon penetrates into the ESL to react with the metal oxide contained therein. Then, the ESL is selectively removed using a wet etchant that includes alkali amine. During the selective etching, the ESL portion that contains metal oxide gets removed, but the ESL portion that contains metal silicon oxide remains. The remaining ESL portion protects the ILD from being undesirably etched in a via hole etching process.

One advantage is that the present disclosure alleviates problems caused by overlay shift. For example, a via hole ideally should be aligned with the conductive element. However, due to an overlay shift, the via hole and the conductive element may be misaligned. Had the selectively-removable ESL not been implemented, such a misalignment would cause a portion of the ILD located below the via hole to be inadvertently etched. When the via hole is filled with metal, so will the inadvertently etched hole, providing a conductive path closer to the next conductive component had the via hole been aligned. This could cause reliability and/or performance problems such as breakdown voltage, TDDB, or leakage.

As discussed above, in real world semiconductor fabrication, overlay control may not be optimal, particularly as geometry sizes shrink, which results in a misalignment between the via hole and the conductive component. But the etch selectivity of the ESL disclosed herein helps prevent the misalignment from causing an undesirable etching of the ILD located below the via hole and adjacent to the conductive component. According to the various aspects of the present disclosure, the silicon-containing ESL protects the portions of ILD located below a misaligned via hole from being etched. As such, the resulting semiconductor device has better reliability and/or enhanced performance.

The various aspects of the present disclosure will now be described in more detail with reference to the figures. In that regard, FIGS. 1A-1I are diagrammatic fragmentary cross-sectional side views of a semiconductor device at different stages of fabrication according to embodiments of the present disclosure, and FIG. 2 is a flowchart illustrating a method performed according to embodiments of the present disclosure.

Refer now to FIG. 1A, which illustrates a portion of a semiconductor device (or semiconductor structure) 100. The semiconductor device 100 includes a substrate 102, which may be made of silicon or other semiconductor materials such as germanium. The substrate 102 also may comprise a compound semiconductor such as silicon carbide, gallium arsenic, indium arsenide, or indium phosphide. In some embodiments, the substrate 102 may comprise alloy semiconductor such as silicon germanium, silicon germanium carbide, gallium arsenic phosphide, or gallium indium phosphide. In some embodiments, the substrate 102 may include an epitaxial layer, for example an epitaxial layer overlying a bulk semiconductor. Various microelectronic components may be formed in or on the substrate 102, such as transistor components including source/drain and/or gate, isolation structures including shallow trench isolation (STI), or any other suitable components.

The semiconductor device 100 also includes an interconnect layer 110. The interconnect layer 110 may be one of the interconnect layers in a multi-layered interconnect structure (MLI), which is formed over the substrate 102 and may include multiple patterned dielectric layers and conductive layers that provide interconnections (e.g., wiring) between the various microelectronic components of the semiconductor device 100. There may be intermediate layers or components between the interconnect layer 110 and the substrate 102, but in the interest of simplicity such layers or components are not shown.

In an embodiment, the interconnect layer 110 includes multiple conductive components including 120 and 122, as well as an interlayer dielectric (ILD) 130 that partially or fully surrounds the conductive components 120 and 122. The conductive components 120 and 122 may include contacts, vias, or metal lines. In some embodiments, the conductive components 120 and 122 comprise conductive materials such as aluminum, aluminum alloy, titanium, titanium nitride, tungsten, copper, copper alloy, tantalum, tantalum nitride, tungsten, ruthenium, rhodium, or combinations thereof. When the conductive components 120 and 122 contain metal material(s), they are also called metal components. Note that the conductive components 120 and 122 do not contain any silicon (pure or in silicide forms), and the reason is that the conductive components 120 and 122 should not react with an overlying layer (e.g., an ESL 140, which is described below) during a baking process to form a silicide.

Unlike the conductive components 120 and 122, the ILD 130 may be a silicon-containing dioxide material where silicon exists in various suitable forms. For example, the ILD 130 may include silicon dioxide or a low-k dielectric material whose k-value (dielectric constant) is smaller than that of silicon dioxide, which is about 4. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. It is understood that a planarization process such as chemical mechanical polishing (CMP) may be performed to the interconnect layer 110 to flatten the upper surfaces of the conductive components 120 and 122 and/or the ILD 130.

Referring to FIG. 1B, a first ESL 140 is deposited on the interconnect layer 110. The deposition process includes chemical vapor deposition (CVD), physical vapor deposition (PVD), atomic layer deposition (ALD), thermal ALD, or combinations thereof. In some embodiments, the ESL 140 includes a metal oxide such as aluminum oxide (AlOx), hafnium oxide (HfOx), titanium oxide (TiOx), manganese oxide (MnOx), vanadium oxide (VOx), or another suitable metal oxide, or combinations thereof. In some embodiments, the ESL 140 has a generally uniform thickness of between 10 and 60 Angstroms (A). Such a thickness range allows the ESL 140 not only to provide sufficient protection (in terms of current leakage path between upper via structure and lower conductive components), but also to minimize parasitic capacitance between neighboring conductive components 120 and 122 (since material(s) in the ESL 140 has a higher k value than the low-k material in the ILD 140).

Figure 2:
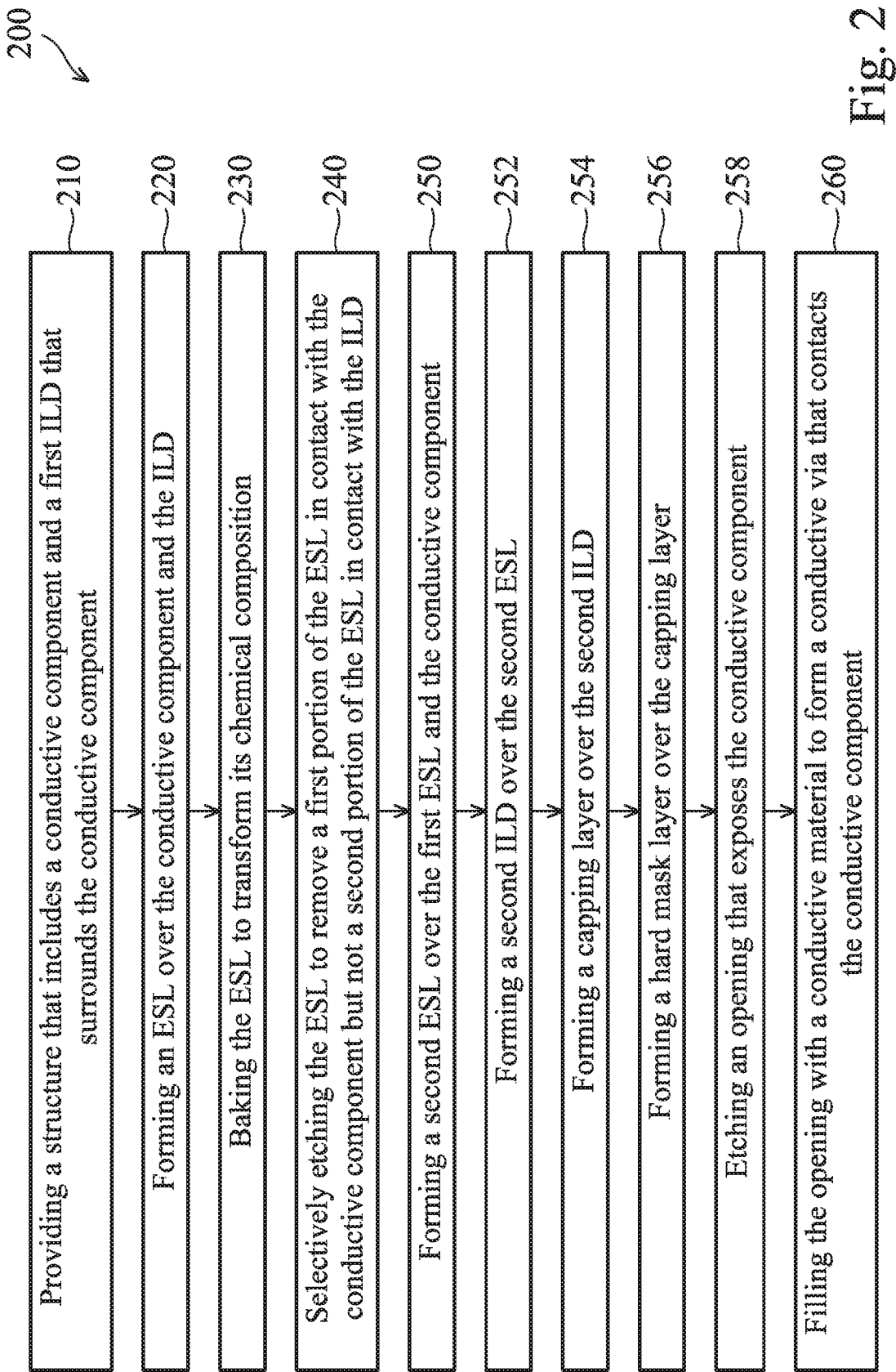
FIG. 2 is a flow chart of a method for fabricating a semiconductor device in accordance with embodiments of the present disclosure.

Referring to FIG. 1C, the ESL 140 undergoes a baking process at an elevated temperature. Such a baking process is not done in existing technologies. During baking, one or more portions 142 of the ESL 140 that are in contact with the ILD 130 change or transform in their chemical composition, for example, as silicon contained in the ILD 130 (in any suitable form) migrates or penetrates into the ESL 140 and then reacts with the metal oxide of the ESL portions 142 to form a metal silicon oxide. In some embodiments, the post-baking ESL portions 142 include a metal silicon oxide such as aluminum silicon oxide (AlSiOx), hafnium silicon oxide (HfSiOx), titanium silicon oxide (TiSiOx), manganese silicon oxide (MnSiOx), vanadium silicon oxide (VSiOx), or another suitable metal silicon oxide, or combinations thereof. Note that the silicon may exist in any suitable chemical form in the metal silicon oxide. However, during baking, one or more other portions 144 of the ESL 140 that are in contact with the conductive components 120 and 122 may not form any metal silicon oxide since the conductive components 120 and 122 do not include any silicon material. As illustrated in FIG. 1C, the chemical transformation is a self-aligning process because ESL portions 142 and 144 are aligned with respective edges of the ILD 130 and conductive components 120 and 122. Note that, even in the self-aligning process, the migration or penetration of silicon into the ESL may not follow a strictly vertical line, thus edges of the ESL portions 142 and 144 may not strictly align with respective edges of the ILD 130 and conductive components 120 and 122.

In some embodiments, the semiconductor device 100 with the ESL 140 is baked at a temperature between 100 and 400 degrees Celsius. Note that the temperature may vary during baking, for example, according to a predefined temperature profile. In some embodiments, baking lasts between 30 seconds and 10 minutes. In some embodiments, baking may be conducted in an ambient gas including nitrogen (N2), a combination of nitrogen and hydrogen (H2), a combination of nitrogen and an inert gas such as argon (Ar), or any other suitable gas composition. The suitable ambient gas (e.g., N2+H2) helps enhance the silicidation process by making it easier for silicon to penetrate into the ESL portions 142.

Figure 1D:
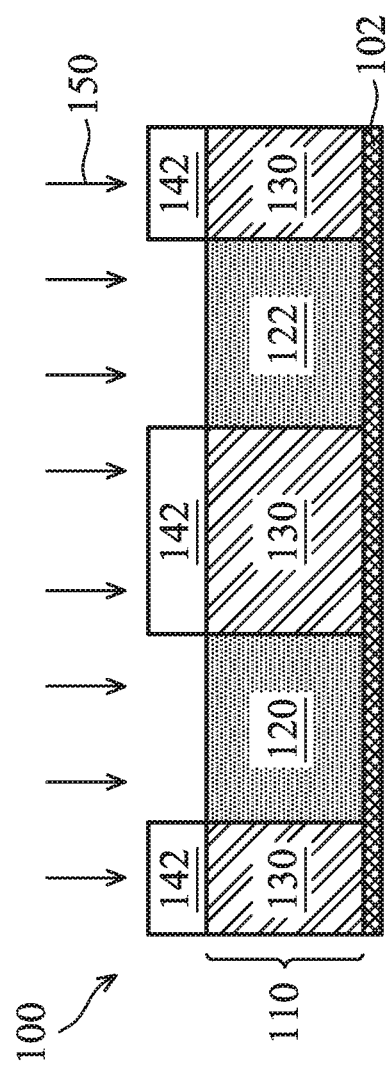

Referring now to FIG. 1D, a wet etching process is performed to selectively remove portions of the ESL 140 from the upper surfaces of the semiconductor device 100. In an embodiment, an etch solution 150 is configured such that the ESL portions 142 in contact with the ILD 130 would remain but the ESL portions 144 in contact with the conductive components 120 and 122 would be removed. In other words, post etching the ESL 140 remains on the upper surfaces of the ILD 130, but not on the upper surfaces of the conductive components 120 and 122. As shown in FIG. 1D, a step height profile or geometry is created along the upper surface of the conductive components 120 and 122.

The reason for the selective removal of the ESL 140 is etch selectivity between the ESL portions 142 and 144, which after baking contain different materials. In some embodiments, the etch selectivity between the ESL portions 142 and 144 is substantial (e.g., about 1:30 or more). That is, when exposed to the etch solution 150, the etch rate of an ESL portion 144 (which contains a metal oxide) is at least 30 times faster than the etch rate of an ESL portion 142 (which contains a metal silicon oxide). In some embodiments, the etch rate of an ESL portion 144 is about 20 A per minute or more. Further, etching may stop once upper surfaces of the conductive components 120 and 122 are exposed, since the etch solution 150 has a low etch rate on the conductive components 120 and 122. In some embodiments, the etch rate of the conductive components 120 and 122 is no more than 1 A per minute.

In some embodiments, the etch solution 150 includes alkali amine such as ammonia hydroxide (NH4OH), hydroxylamine (NH2OH), another suitable chemical compound, or combinations thereof. A pH value of the etch solution 150 may be set to between 8-13 to prevent or minimize the reaction between silicon and the etch solution 150 (because silicon is more active in an acid environment). In an embodiment, a concentration of alkali amine in the etch solution 150 is 8% or less (percentage is by weight unless otherwise noted). The hydroxide (OH—) in alkali amine allows the etch rate difference between metal oxide (contained in ESL portions 144) and metal silicon oxide (contained in ESL portions 142). Specifically, the following example formula suggest that hydroxide reacts with a metal oxide to form a metal hydroxide (e.g., aluminum hydroxide), which is soluble in the etch solution 150, but hydroxide does not react with a metal silicon oxide:

Example reaction in ESL portions 144: $2OH^-+3H_2O+Al_2O_3 \rightarrow 2Al(OH)_4^-{}_{(aq)}$

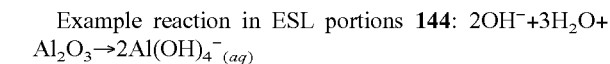

No reaction in ESL portions 142: $OH^-+Al(Si)Ox \rightarrow No$ reaction.

To enhance etching performance, the etch solution 150 may also include a solvent such as diethylene glycol monomethyl ether, ethylene glycol, butyl diethylene glycol, dimethyl sulfoxide, or any other suitable solvent, or combinations thereof. In addition, the etch solution 150 may include a chelator such as ethylenediaminetetraacetic acid, diethylenetriaminepentaacetic acid, or another suitable chelator, or combinations thereof. Further, the etch solution 150 may include a metal corrosion inhibitor to help prevent corrosion of metal components. The suitable candidates for the metal corrosion inhibitor may include benzotriazole (BTA), dodecylamine, or combinations thereof. The etch solution 150 may also include water, for example, with a concentration of between 20% and 80%. In some embodiments, the wet etching process is performed at a temperature between room temperature and 60 degrees Celsius. Note that the temperature may vary during etching. In some embodiments, etching lasts between 1 and 5 minutes.

Figure 1E:
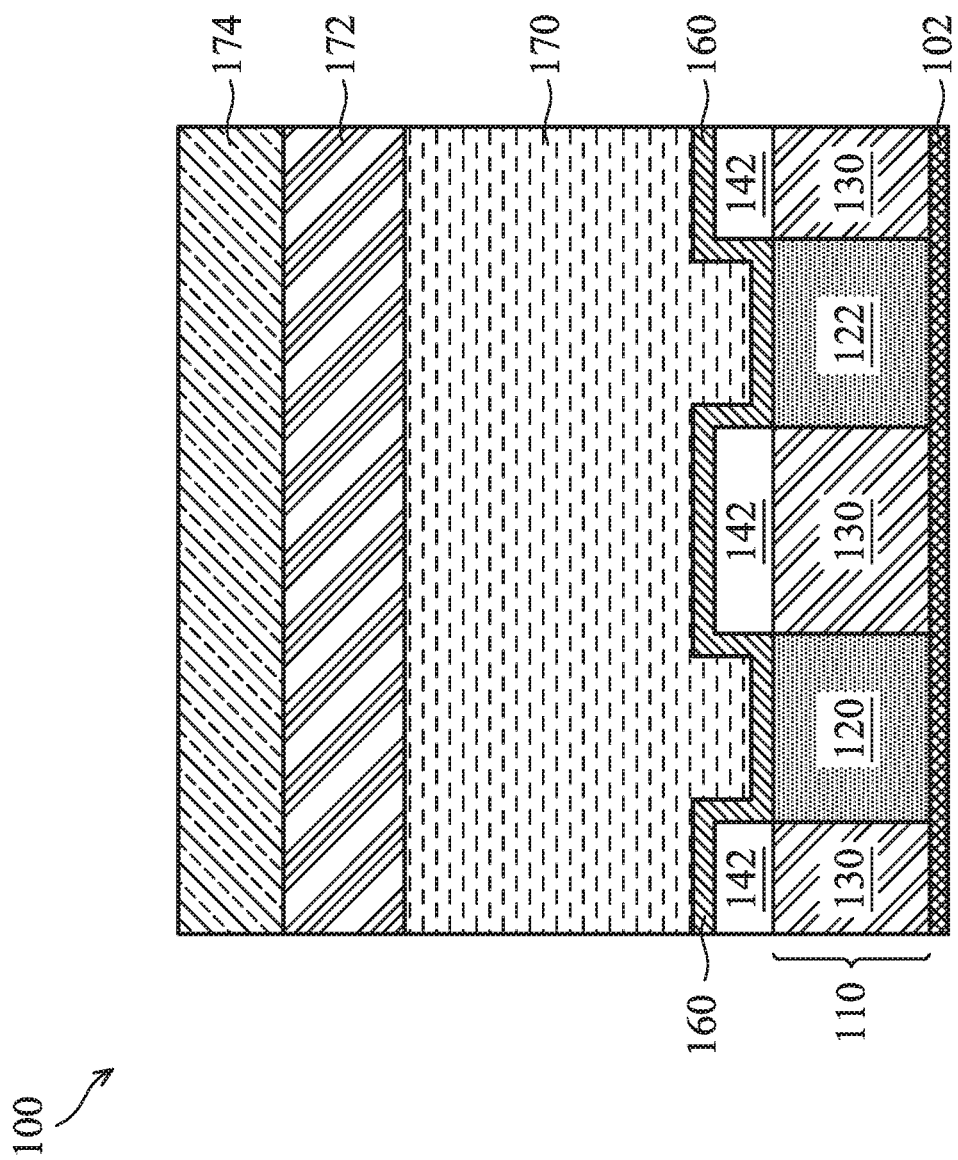

Referring now to FIG. 1E, a deposition process is performed to form a second ESL 160 over the semiconductor device 100. In some embodiments, the deposition process may include a CVD process, a PVD process, an ALD process, thermal ALD, or combinations thereof. The ESL 160 may be formed conformally over the remaining portions of the ESL 140 and over the upper surfaces of the conductive components 120 and 122. In some embodiments, the ESL 160 includes a dielectric material, which may be the same material as or different from that of the ESL 140. In some embodiments, the ESL 140 includes a metal oxide such as aluminum oxide (AlOx), hafnium oxide (HfOx), titanium oxide (TiOx), manganese oxide (MnOx), vanadium oxide (VOx), or another suitable metal oxide, or combinations thereof. Alternatively, the ESL 160 may include silicon carbon nitride (SiCN), silicon oxycarbide (SiOCN), silicon carboxide (SiC), or silicon nitride (SiN), or combinations thereof. In some embodiments, the ESL 140 has a thickness of 50 A or less. The ESL 160 may serve purposes such as adhesion, metal oxidation prevention, metal damage prevention, and universal etching performance insurance.

Still referring to FIG. 1E, another deposition process is performed to form an ILD 170 over the ESL 160. The deposition process may include a process such as CVD, PVD, ALD, or combinations thereof. In some embodiments, the ILD 170 may include a low-k dielectric material, such as SiOCH, TEOS, BPSG, FSG, etc. In some embodiments, the ILD 130 and the ILD 170 have the same material composition.

In some embodiments, a capping layer 172 is formed on the ILD 170. The capping layer 172 may be deposited using PVD, CVD, ALD, and/or other suitable methods. The capping layer 172 may use any suitable material such as silicon, silicon oxide (SiO2), silicon nitride (SiN), silicon carbonitride (SiCN), silicon carbide (SiC), or combinations thereof.

In some embodiments, a hard mask (HM) layer 174 is formed over the top surface of semiconductor device 100. The HM layer 174 may include any suitable material. In an embodiment, the HM layer 174 includes silicon, silicon carbonitride (SiCN), hafnium oxide (HfO2), alumina (Al2O3), zirconium oxide (ZrO2), titanium nitride (TiN), tungsten carbide (WC), or another isolation material, or combinations thereof. The HM layer 174 may be formed by PVD, CVD, ALD, plating, or other suitable methods.

Figure 1F:
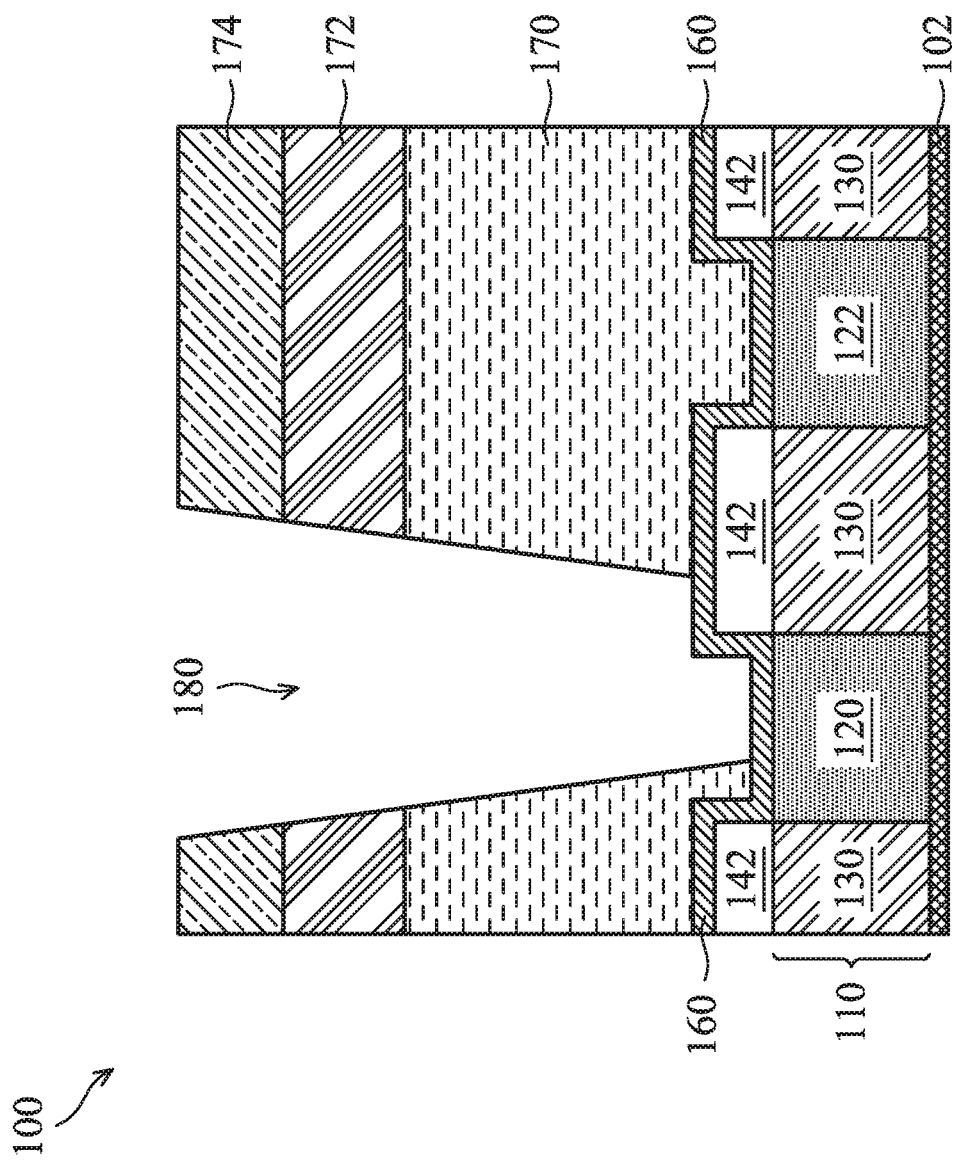

Referring now to FIG. 1F, one or more processes are performed to etch an opening 180 that extends vertically through, from top to bottom, the HM layer 174, the capping layer 172, and the ILD 170 to reach the ESL 160. In some embodiments, a lithography process is first performed on the HM layer 174 to define a position of the opening 180 (e.g., by photoresist deposition, light exposure, and photoresist removal). Then, an etching process may be used to remove the HM layer 174. This etching process may include wet etching or dry etching. The same etching process or another etching process may be used to remove the capping layer 172 and the ILD 170. In an embodiment, drying etching is used to remove the capping layer 172 and the ILD 170. As shown in FIG. 1F, the opening 180 is not perfectly aligned with metal component 120, as can happen when the overlay is off. In FIG. 1F, the opening 180 stops at the ESL 160, which has a very low etch rate in the etching process. The ESL 160, sometimes called a liner, helps ensure proper creation of the opening through different material layers.

Figure 1G:
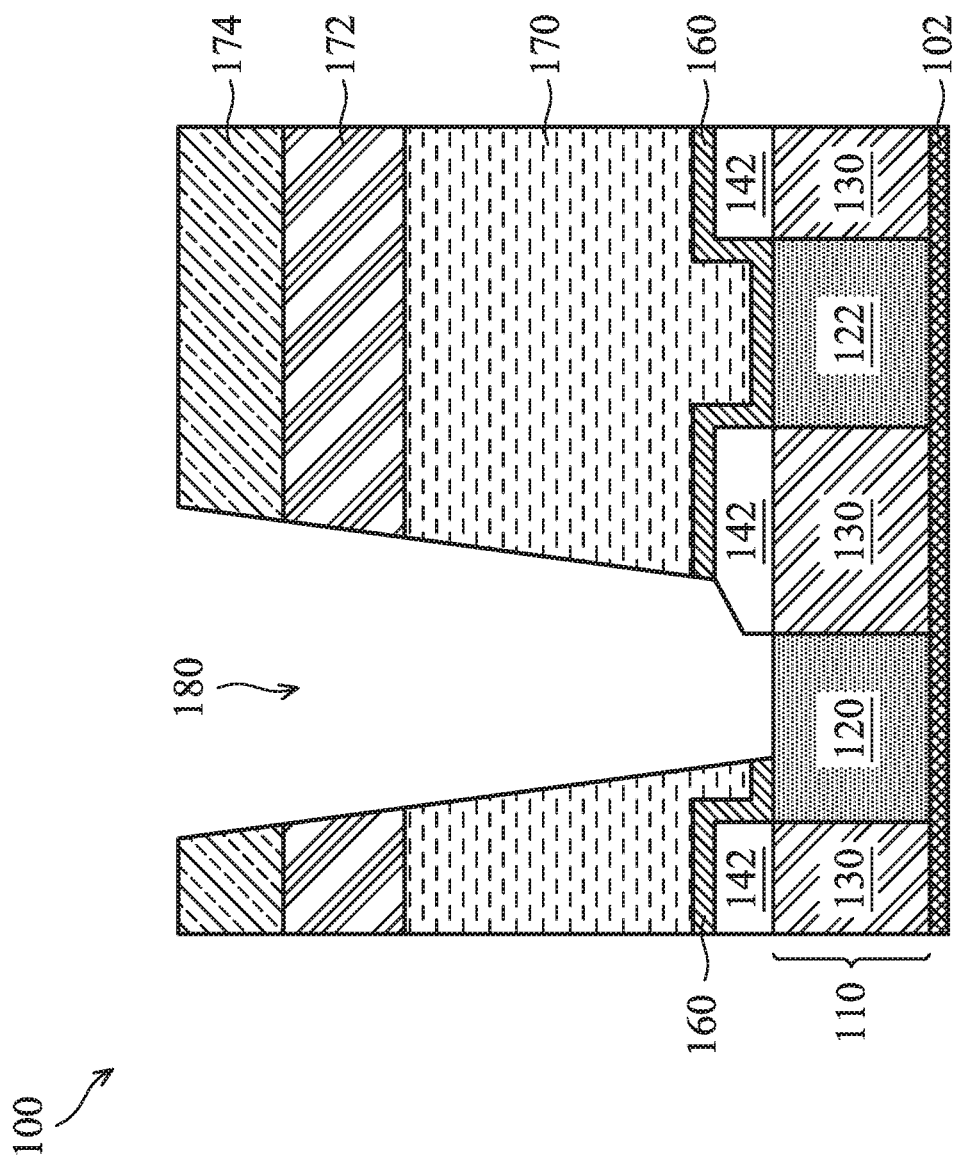

Referring now to FIG. 1G, a portion of the ESL 160 situated on the bottom of the opening 180 is removed using another etching process. This etching process may include wet etching or dry etching, and etches the ESL 160 faster than surrounding materials. As a result, the opening 180 is extended to the upper surface of the conductive component 120. In some embodiments, a middle ESL portion 142, which is situated below the opening 180, is also partially etched away by the etching process. When the middle ESL portion 142 and the ESL 160 are the same material (as deposited), a duration of the etching process is controlled such that the middle ESL portion 142 is not fully etched. Otherwise, when the middle ESL portion 142 and the ESL 160 are different materials (as deposited), the etching process may have a relatively lower etch rate on the ESL portion 142 (but an upper corner of the middle ESL portion 142 may still get chipped away as illustrated in FIG. 1G). In any case, the etching process ensures that the opening 180 does not reach the ILD 130.

The opening 180 will be filled by a conductive material later, for example, to form a conductive component such as a via or a metal line. Ideally, the opening 180 should be aligned with the conductive component 120, such that a good electrical connection can be established between the conductive component 120 and the conductive component to be formed in the opening 180. However, as is often the case in real world semiconductor fabrication, the alignment between the opening 180 and the conductive component 120 is imperfect due to overlay control capability limitations. This problem is exacerbated as the geometry sizes shrink for each semiconductor technology node. Consequently, as shown in FIG. 1F, a misalignment exists between the opening 180 and the conductive component 120, which is manifested as the opening 180 being shifted "to the right" such that the opening 180 is now located above a portion of the ILD 130. In conventional semiconductor devices, such a misalignment may have led to an undesirable etching of the portion of the ILD 130 located under the opening 180 as a result of over-etching. The over-etched portion of the ILD 130 would then be filled with the conductive material later when the conductive material fills the opening 180. This may cause problems such as time-dependent dielectric breakdown (TDDB) or leakage within the semiconductor device 100.

The present disclosure overcomes the problem discussed above by forming the ESL portions 142, which prevent the potential etching of the ILD 130 (when the opening 180 is created). In more detail, as shown in FIG. 1G, the etched opening 180 vertically stops at the middle ESL portion 142. As discussed above, the material compositions of the ESL 142 and the ESL 160 may be configured such that a significant etching selectivity exists between them during the creation of the opening 180. As such, the ESL 160 may be substantially etched through without significantly affecting the middle ESL portion 142, which allows the middle ESL portion 142 to serve as a protective structure. Since the middle ESL portion 142 is preserved, the portion of the ILD 130 located below the middle ESL portion 142 is also protected from being etched.

Figure 1H:
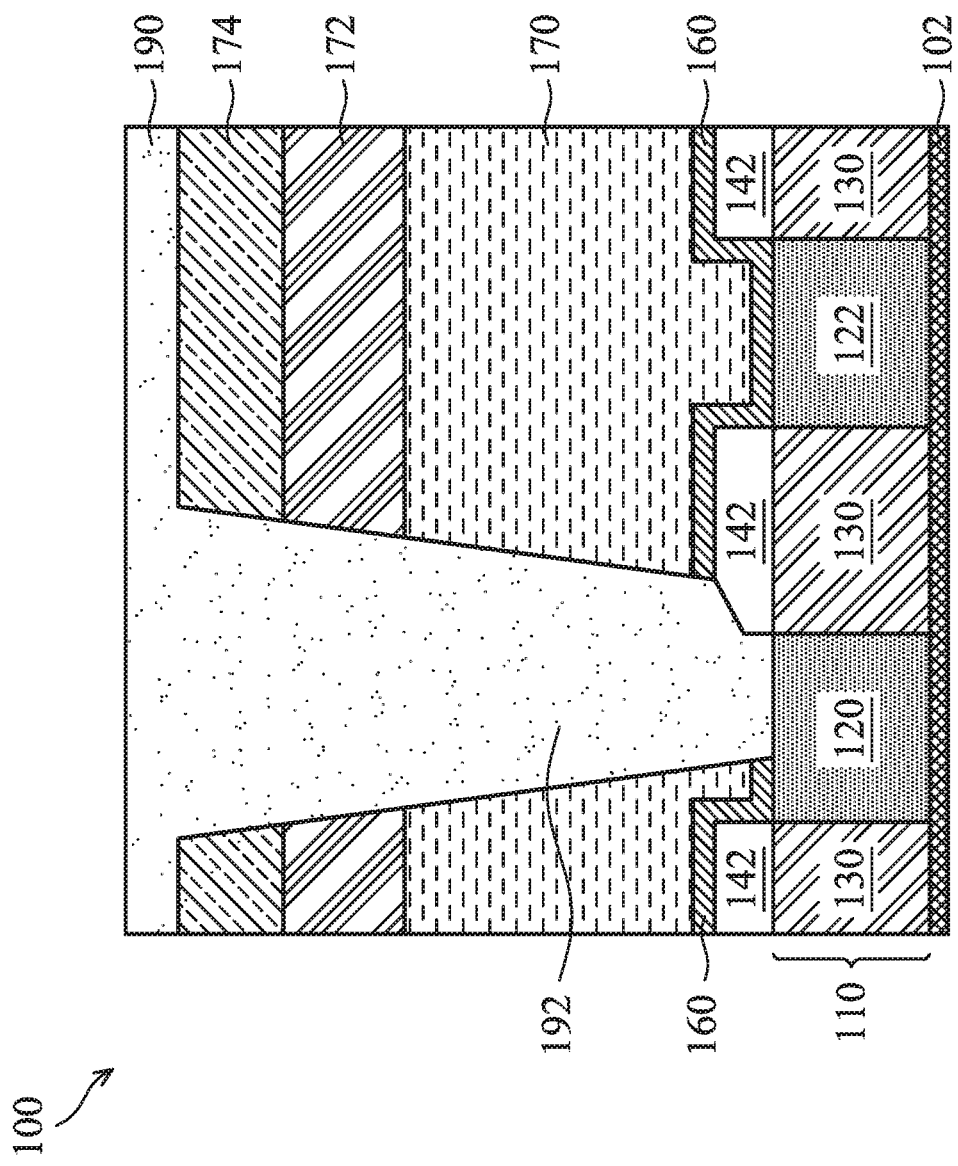

Referring now to FIG. 1H, a deposition process is performed to form a conductive material 190 over the semiconductor device 100. In various embodiments, the conductive material includes copper, tungsten, aluminum, other suitable metal, metal alloy or combinations. The deposition process may include a process such as CVD, plating, PVD, ALD, or combinations thereof. In some embodiments, the deposited conductive material 190 includes a metal or metal alloy such as copper, aluminum, tungsten, titanium, or combinations thereof. In some embodiments, a barrier layer (such as titanium, titanium nitride, tantalum, tantalum nitride or combination) may be formed on the sidewalls of the opening 180, and the conductive material is filled in the opening 180 thereafter.

A portion of the deposited conductive material 190 fills the opening 180 to form a conductive via 192. In some embodiments, the conductive via 192 serves as a conductive element, which is electrically connected to the conductive component 120 below. Again, since the middle ESL portion 142 serves as a protective layer during the etching of the via opening, the portion of the ILD 130 below the middle ESL portion 142 is not etched. Therefore, the deposited conductive material 190 will not inadvertently reach the ILD 130, even if the conductive components 120 and 520 are misaligned due to an overlay shift.

Figure 1I:
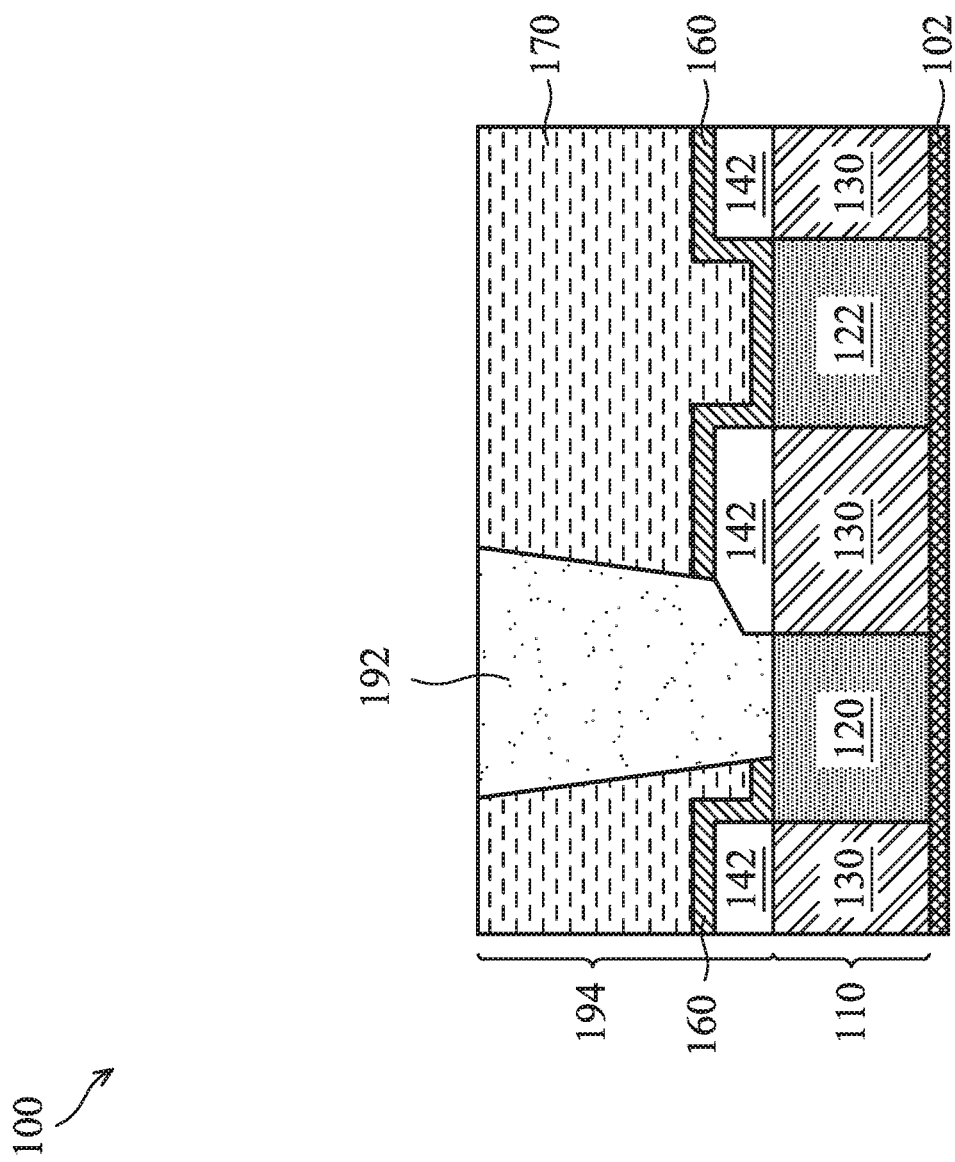

Referring now to FIG. 1I, a planarization process such as chemical mechanical planarization (CMP) is performed to planarize an upper portion of the conductive material 190, thereby leaving the conductive via 192 surrounded by the ILD 170. The conductive via 192 and the ILD 170 may be considered portions of a second interconnect layer 194 of the multi-layer interconnect structure, which is located above the interconnect layer 110.

In some embodiments, the interconnect layer 110 is a $M_n$ (e.g., Metal-0) interconnect layer, and the interconnect layer 194 is a $M_{n+1}$ (Metal-1) interconnect layer. In some embodiments, a pitch (distance between neighboring conductive components) in the $M_n$ interconnect layer is between 16 and 40 nm, and a critical dimension (CD) of a conductive components is about 20 nm or less. In some embodiments, a critical dimension (CD) of a bottom surface of a conductive via in the $M_{n+1}$ interconnect layer is about 24 nm or less, in which case an overlay shift tolerance may be about 8 nm or less. Note that the overlay shift tolerance depends heavily on the pitch in the $M_n$ interconnect layer (e.g., if the pitch is 40 nm, the overlay shift tolerance may be about 8 nm, but if the pitch decreases to 20 nm, the overlay shift tolerance may decrease to 4-6 nm). The present disclosure improves the overlay shift tolerance by using the selectively removable ESL 140.

Note that at this stage of fabrication, most of the middle ESL portion 142 (if not all) is still disposed between the conductive via 192 and the ILD 130. In other words, the middle ESL portion 142 separates the conductive via 192 and the ILD 130, and prevents or minimizes a leakage current flowing between the conductive via 192 and the conductive component 122. In some embodiments, depending on the ESL thickness, current leakage may be reduced by 1 to 2 orders using techniques disclosed herein. The middle ESL portion 142 remains detectable in the final structure of the semiconductor device 100. Indeed, the presence of the middle ESL portion 142, which contains a metal silicon oxide as described above, is one of the unique physical characteristics of the present application and may indicate that the steps of the present disclosure have been performed.

FIG. 2 is a flowchart of a method 200 for fabricating a semiconductor device (e.g., the semiconductor device 100) in accordance with various aspects of the present disclosure. The method 200 should be understood in connection with FIGS. 1A-1I. To start off, the method 200 includes a step 210 for providing a structure that includes a conductive component (e.g., the conductive component 120) and an ILD such as the ILD 130, which may fully or partially surround the conductive component 120. More details are described above with reference to FIG. 1A.

The method 200 includes a step 220 for forming, over the conductive component and the ILD, an ESL such as the ESL 140, which includes a metal oxide. More details are described above with reference to FIG. 1B. The method 200 includes a step 230 for baking the ESL to transform its chemical composition. In an embodiment, after the chemical composition transformation, a first portion of the ESL in contact with the conductive component (e.g., ESL portion 144) does not include any metal silicon oxide, while a second portion of the ESL in contact with the ILD (e.g., ESL portion 142) includes a metal silicon oxide. Thus, baking selectively transforms the ESL portion 142 into metal silicon oxide. The metal silicon oxide is formed during the baking by a chemical reaction between the silicon in the ILD and the metal oxide in the second portion of the ESL. More details are described above with reference to FIG. 1C.

The method 200 includes a step 240 for selectively etching the ESL so as to remove the first portion of the ESL but not the second portion of the ESL. Note that, in practice, not removing a layer or structure may not be absolute (that is, a small portion of that layer or structure can still get removed, even though there is a substantial difference between etch selectivity). In an embodiment, the selective etching of the ESL is configured such that an etch rate of the first portion of the ESL is substantially greater (e.g., at least 30 times faster) than an etching rate of the second portion of the ESL. More details are described above with reference to FIG. 1D.

The method 200 includes a step 250 for forming a second ESL (e.g., the ESL 160) over the second portion of the first ESL and over the first conductive component. At step 252, a second ILD (e.g., the ILD 170) may be formed over the second ESL. At step 254, a capping layer (e.g., the capping layer 172) may be formed over the second ILD. At step 256, a HM layer (e.g., the HM 174) may be formed over the capping layer. More details regarding steps 250-256 are described above with reference to FIG. 1E.

The method 200 includes a step 258 for etching an opening (e.g., the opening 180) that exposes an upper surface of the first conductive component. The opening may be fully aligned with the conductive component (when there is no overlay shift) or partially aligned with the conductive component (when there is some overlay shift). In any case, the second portion of the first ESL protects a portion of the first ILD located therebelow from being etched. More details are described above with reference to FIG. 1F and FIG. 1G.

The method 200 includes a step 260 for filling the opening with a conductive material (e.g., the conductive material 190) to form a conductive via (e.g., the conductive via 192) that contacts the conductive component. More details are described above with reference to FIG. 1H. In some embodiments, step 260 may include a CMP process as described with reference to FIG. 1I.

It is understood that the method 200 is merely an example, and is not intended to limit the present disclosure beyond what is explicitly recited. Additional steps can be provided before, during, and after the method 200, and some steps described can be replaced, eliminated, or moved around for additional embodiments of the method 200. It is also understood that the various aspects of the present disclosure may be applied to planar transistors as well as FinFET devices. For example, the method 200 may include the formation of source/drain regions and gate structures of a transistor before the step 210 is performed, and the formation of additional interconnect layers, packaging, and testing, after the step 260 is performed. Other steps may be performed but are not discussed herein in detail for reasons of simplicity.

Based on the above discussions, it can be seen that the present disclosure offers advantages over conventional devices and the fabrication thereof. It is understood, however, that other embodiments may offer additional advantages, and not all advantages are necessarily disclosed herein, and that no particular advantage is required for all embodiments.

One advantage is that the present disclosure alleviates problems caused by overlay shift. For example, a via hole ideally should be aligned with the conductive element. However, due to an overlay shift, the via hole and the conductive element may be misaligned. Had the selectively-removable ESL not been implemented, such a misalignment would cause a portion of the ILD located below the via hole to be inadvertently etched. This could cause reliability and/or performance problems such as breakdown voltage, TDDB, or leakage. Here, the selectively-removable ESL serves as a separator and insulator between the via and the ILD. As a result, the ESL protects portions of the ILD underneath from being undesirably etched in the via hole etching process, which in turn improves the reliability and/or performance of the semiconductor device.

One aspect of the present disclosure involves a method for semiconductor device fabrication, the method comprising providing a structure that includes a conductive component and an ILD that includes silicon and surrounds the conductive component, and forming, over the conductive component and the ILD, an ESL that includes metal oxide. The ESL includes a first portion in contact with the conductive component and a second portion in contact with the ILD. The method further comprises baking the ESL to transform the metal oxide located in the second portion of the ESL into metal silicon oxide, and selectively etching the ESL so as to remove the first portion of the ESL but not the second portion of the ESL.

In some embodiments, the ESL is formed to have a thickness between 10 and 60 A. In some embodiments, baking the ESL does not transform the metal oxide located in the first portion of the ESL into metal silicon oxide. The metal silicon oxide in the second portion of the ESL is formed during the baking by a chemical reaction between the silicon in the ILD and the metal oxide in the second portion of the ESL. The ESL is baked in an ambient gas comprising nitrogen and hydrogen. In some embodiments, the ESL is baked at a temperature between 100 to 400 degree Celsius. In some embodiments, the metal silicon oxide in the second portion of the ESL is selected from the group consisting of aluminum silicon oxide (AlSiOx), hafnium silicon oxide (HfSiOx), titanium silicon oxide (TiSiOx), manganese silicon oxide (MnSiOx), and vanadium silicon oxide (VSiOx). In some embodiments, the selective etching of the ESL is performed using an etch solution, and wherein the etch solution includes ammonia hydroxide, or hydroxylamine, or both. In some embodiments, the etch solution further includes water, a chelator, a metal corrosion inhibitor, as well as a solvent that is selected from the group consisting of diethylene glycol monomethyl ether, ethylene glycol, butyl diethylene glycol, and dimethyl sulfoxide. In some embodiments, the selective etching of the ESL is configured such that an etch rate of the first portion of the ESL is substantially greater than an etching rate of the second portion of the ESL.

In some embodiments, the ILD is a first ILD and the ESL is a first ESL. The method further comprises forming a second ESL over the second portion of the first ESL and over the first conductive component, forming a second ILD over the second ESL, and etching an opening in the second ILD and in the second ESL. The opening is at least partially aligned with the conductive component. The second portion of the first ESL protects a portion of the first ILD located therebelow from being etched. The method further comprises filling the opening with a conductive material to form a conductive via that contacts the conductive component. In some embodiments, the method further comprises, after forming the second ILD and before etching the opening in the second ILD, forming a capping layer over the second ILD and forming a hard mask layer over the capping layer. The opening penetrates, from top to bottom, at least the hard mask layer, the capping layer, the second ILD, and the second ESL.

Another aspect of the present disclosure involves a semiconductor device, comprising a substrate, first and second conductive components disposed on the substrate, an ILD disposed on the substrate and between the first and second conductive components, and an ESL—which comprises a metal silicon oxide—extending over and in contact with the ILD. The ESL does not extend over either the first conductive component or the second conductive component. The semiconductor device further comprises a conductive via disposed over and in electrical contact with the first conductive component. The conductive via is separated from the second conductive component by at least the ILD and a portion of the ESL. In some embodiments, the semiconductor device further comprises a second ESL disposed over the first ESL and adjacent the conductive via, and a second ILD disposed over the second ESL and surrounding the conductive via. In some embodiments, the conductive via partially covers an upper surface of the first conductive component, and the second ESL also partially covers the upper surface of the first conductive component. In some embodiments, the metal silicon oxide in the ESL is selected from the group consisting of aluminum silicon oxide (AlSiOx), hafnium silicon oxide (HfSiOx), titanium silicon oxide (TiSiOx), manganese silicon oxide (MnSiOx), and vanadium silicon oxide (VSiOx). In some embodiments, the ILD comprises silicon. In some embodiments, the ESL has a thickness between 10 and 60 A.

Yet another aspect of the present disclosure involves a method, comprising forming a first ESL including a first portion in contact with a conductive component and including a second portion in contact with a first ILD which surrounds the conductive component. The first portion of the first ESL includes metal oxide, and the second portion of the first ESL includes metal silicon oxide. The method further comprises etching the first ESL to remove the first portion of the first ESL but not to remove the second portion of the first ESL, forming a second ESL over the second portion of the first ESL and over the conductive component, forming a second ILD over the second ESL, etching an opening that vertically penetrates through the second ILD and the second ESL to expose an upper surface of the conductive component, and filling the opening with a conductive material to form a conductive via in the opening. The conductive via is in contact with the upper surface of the conductive component but is separated from the first ILD by the second portion of the first ESL.

In some embodiments, forming the first ESL comprises depositing the first ESL including metal oxide in the first and second portions but not including any metal silicon oxide in the first and second portions, and baking the first ESL at a temperature between 100 to 400 degree Celsius such that the metal silicon oxide in the second portion of the first ESL is formed by a chemical reaction between silicon in the first ILD and the metal oxide in the second portion of the first ESL. In some embodiments, the opening is partially aligned with the conductive component, and the second portion of the first ESL protects the first ILD located therebelow from being etched during etching of the opening. In some embodiments, etching the first ESL comprises using a wet etch solution that includes alkali amine, and etching the opening comprises using a dry etch process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor device fabrication, the method comprising:

providing a structure that includes a conductive component and an interlayer dielectric (ILD) that includes silicon and surrounds the conductive component;

forming, over the conductive component and the ILD, an etch stop layer (ESL) that includes metal oxide, wherein the ESL includes a first portion in contact with the conductive component and a second portion in contact with the ILD;

baking the ESL to transform the metal oxide located in the second portion of the ESL into metal silicon oxide; and selectively etching the ESL so as to remove the first portion of the ESL but not the second portion of the ESL, wherein a portion of the conductive component is exposed after the selectively etching of the ESL; and forming a second ESL directly on the exposed portion of the conductive component such that the second ESL physically contacts the conductive component.

2. The method of claim 1, wherein baking the ESL does not transform the metal oxide located in the first portion of the ESL into metal silicon oxide, and wherein the metal silicon oxide in the second portion of the ESL is formed during the baking by a chemical reaction between the silicon in the ILD and the metal oxide in the second portion of the ESL, and wherein the ESL is baked in an ambient gas comprising nitrogen and hydrogen.

3. The method of claim 2, wherein the ESL is baked at a temperature between 100 to 400 degree Celsius.

4. The method of claim 1, wherein the ESL is formed to have a thickness between 10 and 60 Angstroms (A).

5. The method of claim 1, wherein the metal silicon oxide in the second portion of the ESL is selected from the group consisting of: aluminum silicon oxide (AlSiOx), hafnium silicon oxide (HfSiOx), titanium silicon oxide (TiSiOx), manganese silicon oxide (MnSiOx), and vanadium silicon oxide (VSiOx).

6. The method of claim 1, wherein the selective etching of the ESL is performed using an etch solution, and wherein the etch solution includes ammonia hydroxide, or hydroxylamine, or both.

7. The method of claim 6, wherein the etch solution further includes water, a chelator, a metal corrosion inhibitor, as well as a solvent that is selected from the group consisting of diethylene glycol monomethyl ether, ethylene glycol, butyl diethylene glycol, and dimethyl sulfoxide.

8. The method of claim 1, wherein the selective etching of the ESL is configured such that an etch rate of the first portion of the ESL is substantially greater than an etching rate of the second portion of the ESL.

9. The method of claim 1, wherein the ILD is a first ILD and the ESL is a first ESL, wherein the forming of the second ESL directly on the exposed portion of the conductive component includes forming the second ESL over the second portion of the first ESL, the method further comprising:
forming a second ILD over the second ESL;
etching an opening in the second ILD and in the second ESL, wherein the opening is at least partially aligned with the conductive component, wherein the second portion of the first ESL protects a portion of the first ILD located therebelow from being etched; and
filling the opening with a conductive material to form a conductive via that contacts the conductive component.

10. The method of claim 9, further comprising, after forming the second ILD and before etching the opening in the second ILD:
forming a capping layer over the second ILD; and
forming a hard mask layer over the capping layer,
wherein the opening penetrates, from top to bottom, at least the hard mask layer, the capping layer, the second ILD, and the second ESL.

11. A method, comprising:
forming a first etch stop layer (ESL) including a first portion in contact with a conductive component and including a second portion in contact with a first interlayer dielectric (ILD) which surrounds the conductive component, wherein the first portion of the first ESL includes metal oxide, and the second portion of the first ESL includes metal silicon oxide;
etching the first ESL to remove the first portion of the first ESL but not to remove the second portion of the first ESL;
forming a second ESL over the second portion of the first ESL and over the conductive component;
forming a second ILD over the second ESL;
etching an opening that vertically penetrates through the second ILD and the second ESL to expose an upper surface of the conductive component; and
filling the opening with a conductive material to form a conductive via in the opening, wherein the conductive via is in contact with the upper surface of the conductive component but is separated from the first ILD by the second portion of the first ESL.

12. The method of claim 11, wherein forming the first ESL comprises:
depositing the first ESL including metal oxide in the first and second portions but not including any metal silicon oxide in the first and second portions; and
baking the first ESL at a temperature between 100 to 400 degree Celsius such that the metal silicon oxide in the second portion of the first ESL is formed by a chemical reaction between silicon in the first ILD and the metal oxide in the second portion of the first ESL.

13. The method of claim 11, wherein the opening is partially aligned with the conductive component, and wherein the second portion of the first ESL protects the first ILD located therebelow from being etched during etching of the opening.

14. The method of claim 11, wherein etching the first ESL comprises using a wet etch solution that includes alkali amine, and wherein etching the opening comprises using a dry etch process.

15. A method for making a semiconductor device, comprising:
forming first and second conductive components on a substrate;
forming an interlayer dielectric (ILD) on the substrate and between the first and second conductive components;
forming an etch stop layer (ESL), which comprises a silicon oxide, extending over and in contact with the ILD, wherein the ESL does not extend over either the first conductive component or the second conductive component; and
converting a portion of the ESL into metal silicon oxide; and
forming a conductive via over and in electrical contact with the first conductive component, wherein the conductive via is separated from the second conductive component by at least the ILD and the metal silicon oxide.

16. The method of claim 15, further comprising:
forming a second ESL over the first ESL and adjacent the conductive via; and
forming a second ILD over the second ESL and surrounding the conductive via.

17. The method of claim 16, wherein the conductive via partially covers an upper surface of the first conductive component, and wherein the second ESL also partially covers the upper surface of the first conductive component.

18. The method of claim 15, wherein the metal silicon oxide in the ESL is selected from the group consisting of: aluminum silicon oxide (AlSiOx), hafnium silicon oxide (HfSiOx), titanium silicon oxide (TiSiOx), manganese silicon oxide (MnSiOx), and vanadium silicon oxide (VSiOx).

19. The method of claim 15, wherein the ESL previously extends over either the first conductive component and/or the second conductive component, and is then selectively removed therefrom.

20. The method of claim 15, wherein the ESL has a thickness between 10 and 60 Angstroms (Å).

* * * * *